United States Patent
Nakayama et al.

(10) Patent No.: US 10,422,551 B2
(45) Date of Patent: Sep. 24, 2019

(54) SUBSTRATE LIQUID PROCESSING APPARATUS, AND CONTROL METHOD OF HEATER UNIT

(71) Applicant: Tokyo Electron Limited, Tokyo (JP)

(72) Inventors: Hisakazu Nakayama, Kumamoto (JP); Tomoaki Ojima, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 597 days.

(21) Appl. No.: 15/089,662

(22) Filed: Apr. 4, 2016

(65) Prior Publication Data

US 2016/0305688 A1 Oct. 20, 2016

(30) Foreign Application Priority Data

Apr. 16, 2015 (JP) .................. 2015-084298

(51) Int. Cl.
*F24H 9/20* (2006.01)
*H05B 3/42* (2006.01)
*F24H 1/00* (2006.01)
*F24H 1/14* (2006.01)
*G05D 23/19* (2006.01)
*H01L 21/67* (2006.01)

(52) U.S. Cl.
CPC ......... *F24H 9/2028* (2013.01); *F24H 1/0072* (2013.01); *F24H 1/142* (2013.01); *G05D 23/1919* (2013.01); *H01L 21/6708* (2013.01); *H01L 21/67017* (2013.01); *H01L 21/67051* (2013.01); *H01L 21/67248* (2013.01)

(58) Field of Classification Search
CPC ........... H05B 1/0247; H05B 3/42; F24H 1/14; F24H 1/16; F24H 1/162; F24H 1/0072; F24H 1/42; F24H 9/2028; H01L 21/67017; H01L 21/67051; H01L 21/6708; H01L 21/67248
See application file for complete search history.

(56) References Cited

U.S. PATENT DOCUMENTS

| | | | |
|---|---|---|---|
| 2003/0007790 A1* | 1/2003 | Harris ................... | F24H 7/0433 392/487 |
| 2005/0183755 A1* | 8/2005 | Fujishima ......... | H01L 21/67248 134/56 R |
| 2013/0152605 A1* | 6/2013 | Mimata ................... | F25B 21/04 62/3.3 |

FOREIGN PATENT DOCUMENTS

JP      2012-057904 A      3/2012

* cited by examiner

*Primary Examiner* — Brian W Jennison
(74) *Attorney, Agent, or Firm* — Abelman, Frayne & Schwab

(57) ABSTRACT

A control device configured to control a power to be supplied to a heater unit. The control device cuts off the power to be supplied to a heating portion when it is determined that an event where a maximum temperature that the processing liquid within the heater unit reaches exceeds a processing liquid upper limit temperature is likely to occur even when a supply of the power to the heating portion is stopped based on an actual temperature of the processing liquid measured by a temperature detector under an assumption that a flow of the processing liquid flowing in a processing liquid supply line is stopped.

13 Claims, 5 Drawing Sheets

FIG. 4

| | | HEATING PORTION TEMPERATURE(°C) | | | |
|---|---|---|---|---|---|
| | | 105 | 110 | 120 | 130 |
| CIRCULATING IPA TEMPERATURE(°C) | 23 | 36 | 38 | 40 | 43 |
| | 30 | 42.5 | 44 | 47 | 50 |
| | 40 | 52.5 | 54 | 57 | 60 |
| | 50 | 62.5 | 64 | 67 | 70 |
| | 60 | 72.5 | 74 | 77 | 80 |
| | 65 | 77.5 | 79 | 82 | 85 |
| | 70 | 82.5 | 84 | 87 | 90 |

SUBSTRATE LIQUID PROCESSING APPARATUS, AND CONTROL METHOD OF HEATER UNIT

CROSS-REFERENCE TO RELATED APPLICATIONS

This application is based on and claims priority from Japanese Patent Application No. 2015-084298, filed on Apr. 16, 2015, with the Japan Patent Office, the disclosure of which is incorporated herein in its entirety by reference.

TECHNICAL FIELD

The present disclosure relates to a technology of controlling a heater unit configured to heat a processing liquid in a substrate liquid processing apparatus.

BACKGROUND

A manufacturing process of a semiconductor device includes a liquid processing step of etching or cleaning a substrate such as, for example, a semiconductor wafer by supplying a chemical liquid to the substrate. When the chemical liquid is supplied to the substrate at a temperature higher than a normal temperature, a chemical liquid supply system including a tank configured to store the chemical liquid and a circulation line connected to the tank is generally used. The chemical liquid within the tank is fed to the circulation line by a pump provided in the circulation line, and is returned again to the tank from the circulation line. The chemical liquid is heated by the heater unit provided in the circulation line. A branch line is connected to the circulation line, and the chemical liquid is supplied to a liquid processing unit through the branch line. The liquid processing unit performs a processing on the substrate using the supplied chemical liquid.

A power to be supplied to a heating portion of the heater unit is controlled based on a deviation between an actual temperature of the chemical liquid within the circulation line detected by a temperature sensor, and a target temperature, and by the control, the temperature of the chemical liquid within the circulation line is maintained at the target temperature. When a component member of the heater unit is overheated, the heater unit may be damaged. In particular, when a water-contact member of the heater unit is damaged, there may be a case in which the chemical liquid may be leaked, thereby causing damage to a substrate liquid processing apparatus and its surroundings. In order to prevent overheating of the component member of the heater unit, for example, Japanese Patent No. 5307780 (Japanese Patent Laid-Open Publication No. 2012-057904) provides a temperature sensor configured to detect the temperature of the component member. When the temperature of the component member exceeds a predetermined upper limit, a control is performed to stop the supply of a power to the heating portion of the heater unit.

However, when the supply of the power to the heating portion of the heater unit is stopped, there is a problem in that the temperature of the component member of the heater unit may be increased due to the residual heat of the heating portion, and thus the component member of the heater unit is overheated.

SUMMARY

According to an exemplary embodiment of the present disclosure, there is provided a liquid processing apparatus including: a processing liquid supply line configured to supply a processing liquid from a processing liquid source to a workpiece; a heater unit including a heating portion configured to heat the processing liquid flowing in the processing liquid supply line; a control device configured to control a power to be supplied to the heating portion; and a temperature detector configured to measure a temperature of the processing liquid flowing in the processing liquid supply line. The control device performs a cut-off control that cuts off the power to be supplied to the heating portion when it is determined that the temperature of the processing liquid within the heater unit is equal to or higher than a processing liquid upper limit temperature when a supply of the power to the heating portion is stopped, and the determination as to whether the temperature of the processing liquid within the heater unit is equal to or higher than the processing liquid upper limit temperature is made based on an actual temperature of the processing liquid measured by the temperature detector under an assumption that a flow of the processing liquid flowing in the processing liquid supply line is stopped.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 4 is a table for explaining the basis of determination of a heating portion upper limit temperature (first and second temperature threshold values).

DETAILED DESCRIPTION

Figure 1:
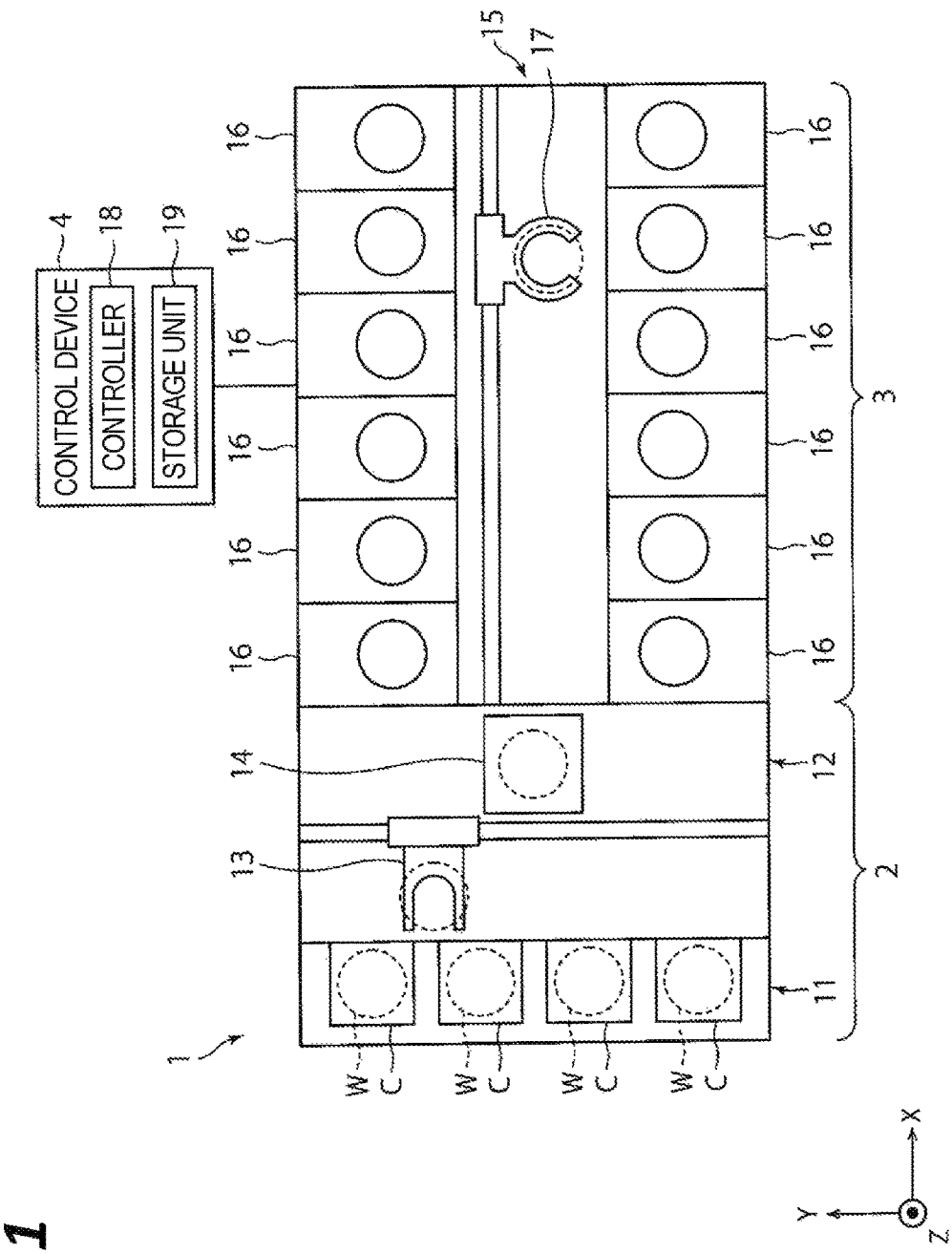
FIG. 1 is a view illustrating a schematic configuration of a substrate processing system according to an exemplary embodiment of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

An object of the present disclosure is to provide a technology of protecting a heater unit.

According to an exemplary embodiment of the present disclosure, a liquid processing apparatus includes: a processing liquid supply line configured to supply a processing liquid from a processing liquid source to a workpiece; a heater unit including a heating portion configured to heat the processing liquid flowing in the processing liquid supply line; a control device configured to control a power to be supplied to the heating portion; and a temperature detector configured to measure a temperature of the processing liquid flowing in the processing liquid supply line. The control device performs a cut-off control that cuts off the power to be supplied to the heating portion when it is determined that the temperature of the processing liquid within the heater unit is equal to or higher than a processing liquid upper limit temperature when a supply of the power to the heating portion is stopped, and the determination as to whether the temperature of the processing liquid within the heater unit is equal to or higher than the processing liquid upper limit temperature is made based on an actual temperature of the processing liquid measured by the temperature detector under an assumption that a flow of the processing liquid flowing in the processing liquid supply line is stopped.

In the liquid processing apparatus, the processing liquid upper limit temperature is a temperature at which an estimated maximum temperature of the processing liquid within the heater unit after a temperature rise and a stop of the flow of the processing liquid imparts damage to the heater unit. In the control device, a heating portion upper limit temperature which is a maximum temperature allowed for the heating portion is set for the actual temperature of the processing liquid such that the temperature of the processing liquid does not reach the processing liquid upper limit temperature, and the determination as to whether the temperature of the processing liquid is equal to or higher than the processing liquid upper limit temperature is made based on the actual temperature of the processing liquid, and the set heating portion upper limit temperature.

In the liquid processing apparatus, the processing liquid upper limit temperature is a temperature at which the processing liquid is boiled, and the processing liquid upper limit temperature is set according to a kind of the processing liquid.

In the liquid processing apparatus, a heating portion upper limit temperature that is a maximum temperature allowed for the heating portion is set for the actual temperature such that the temperature of the processing liquid within the heater unit does not reach the processing liquid upper limit temperature. The control device includes a first controller configured to determine a power to be supplied to the heating portion of the heater unit so that the actual temperature of the processing liquid reaches a target temperature of the processing liquid based on a deviation between the actual temperature of the processing liquid detected by the temperature detector and the target temperature of the processing liquid, and a second controller configured to perform the cut-off control when an actual temperature of the heating portion of the heater unit exceeds the set heating portion upper limit temperature, and allow the power determined by the first controller to be supplied to the heating portion of the heater unit when the actual temperature is equal to or lower than the heating portion upper limit temperature. The heating portion upper limit temperature is set according to the actual temperature of the processing liquid.

In the liquid processing apparatus, as the actual temperature of the processing liquid changes from a temperature below the target temperature of the processing liquid to a temperature close to the target temperature, the heating portion upper limit temperature is set to a temperature which changes from a temperature above the target temperature of the processing liquid to a temperature closer to the target temperature.

In the liquid processing apparatus, the actual temperature of the processing liquid is divided into a plurality of temperature zones, and the heating portion upper limit temperature is set for each of the temperature zones.

In the liquid processing apparatus, when the actual temperature of the processing liquid is increased to a setting temperature, the heating portion upper limit temperature is set to a first heating portion upper limit temperature until the actual temperature of the processing liquid reaches a first processing liquid temperature, and the heating portion upper limit temperature is set to a second heating portion upper limit temperature lower than the first heating portion upper limit temperature until the actual temperature of the processing liquid reaches a second processing liquid temperature higher than the first processing liquid temperature.

In the liquid processing apparatus, the control device includes a PID controller serving as the first controller, an ON/OFF controller serving as the second controller, and a current adjustment unit. The ON/OFF controller is interposed between the PID controller and the current adjustment unit to perform a control of changing a power command value output from the PID controller to the current adjustment unit to zero and outputting the power command value to the current adjustment unit, or outputting the power command value to the current adjustment unit as it is, or perform an equivalent control thereof.

The liquid processing apparatus further includes: a tank configured to serve as the processing liquid source that stores the processing liquid; a circulation line connected to the tank and configured to cause the processing liquid flowing out from the tank to flow through the circulation line and then flow into the tank; a processing unit configured to perform a liquid processing on the workpiece using the processing liquid flowing through the circulation line; and a branch line split from the circulation line to supply the processing liquid flowing through the circulation line to the processing unit. The processing liquid supply line is constituted by at least a part of the circulation line and the branch line.

According to another exemplary embodiment of the present disclosure, a control method of a heater unit includes: performing a liquid processing on a workpiece by supplying a processing liquid to the workpiece through a processing liquid supply line from a processing liquid source; and controlling a temperature of the processing liquid flowing in the processing liquid supply line by controlling a power to be supplied to a heating portion provided in a heater unit, the heating portion being configured to heat the processing liquid flowing in the processing liquid supply line. The controlling of the temperature includes performing a cut-off control that cuts off the power to be supplied to the heating portion when it is determined that an event where a maximum temperature that the processing liquid within the heater unit reaches exceeds a processing liquid upper limit temperature is likely to occur even when a supply of the power to the heating portion is stopped based on an actual temperature of the processing liquid flowing in the processing liquid supply line under an assumption that a flow of the processing liquid flowing in the processing liquid supply line is stopped.

In the method, the processing liquid upper limit temperature is a temperature at which the processing liquid is boiled, and the processing liquid upper limit temperature is set according to a kind of the processing liquid.

In the method, the actual temperature of the processing liquid is divided into a plurality of temperature zones, and a heating portion upper limit temperature is set for each of the temperature zones.

In the method, when the actual temperature of the processing liquid is increased to a setting temperature, the heating portion upper limit temperature is set to a first heating portion upper limit temperature until the actual temperature of the processing liquid reaches a first processing liquid temperature, and the heating portion upper limit temperature is set to a second heating portion upper limit temperature lower than the first heating portion upper limit temperature until the actual temperature of the processing liquid reaches a second processing liquid temperature higher than the first processing liquid temperature.

According to a further exemplary embodiment of the present disclosure, a storage medium stores a program which allows a computer to control the substrate liquid processing apparatus to perform the method, when executed by the computer configured to control an operation of the substrate liquid processing apparatus.

According to exemplary embodiments of the present disclosure, a heater unit is suppressed from being damaged by a calorific value (a residual heat) that a heating portion and a member thermally connected to the heating portion have even when a flow of the processing liquid is stopped.

Hereinafter, an exemplary embodiment of the present disclosure will be described with reference to accompanying drawings.

FIG. 1 is a plan view illustrating an outline of a substrate processing system provided with a processing unit according to an exemplary embodiment of the present disclosure. In the following, in order to clarify positional relationships, the X-axis, Y-axis and Z-axis which are orthogonal to each other will be defined. The positive Z-axis direction will be regarded as a vertically upward direction.

As illustrated in FIG. 1, a substrate processing system 1 includes a carry-in/out station 2 and a processing station 3. The carry-in/out station 2 and a processing station 3 are provided adjacent to each other.

The carry-in/out station 2 is provided with a carrier placing section 11 and a transfer section 12. In the carrier placing section 11, a plurality of carriers C is placed to accommodate a plurality of substrates (semiconductor wafers in the present exemplary embodiment) (hereinafter, referred to as "wafers W") horizontally.

The transfer section 12 is provided adjacent to the carrier placing section 11, and provided with a substrate transfer device 13 and a delivery unit 14. The substrate transfer device 13 is provided with a wafer holding mechanism configured to hold the wafer W. Further, the substrate transfer device 13 is movable horizontally and vertically and pivotable around a vertical axis, and transfers the wafers W between the carriers C and the delivery unit 14 by using the wafer holding mechanism.

The processing station 3 is provided adjacent to the transfer section 12. The processing station 3 is provided with a transfer section 15 and a plurality of processing units 16. The plurality of processing units 16 is arranged at both sides of the transfer section 15.

The transfer section 15 is provided with a substrate transfer device 17 therein. The substrate transfer device 17 is provided with a wafer holding mechanism configured to hold the wafer W. Further, the substrate transfer device 17 is movable horizontally and vertically and pivotable around a vertical axis. The substrate transfer device 17 transfers the wafers W between the delivery unit 14 and the processing units 16 by using the wafer holding mechanism.

The processing units 16 perform a predetermined substrate processing on the wafers W transferred by the substrate transfer device 17.

Further, the substrate processing system 1 is provided with a control device 4. The control device 4 is, for example, a computer, and includes a controller 18 and a storage unit 19. The storage unit 19 stores a program that controls various processings performed in the substrate processing system 1. The controller 18 controls the operations of the substrate processing system 1 by reading and executing the program stored in the storage unit 19.

Further, the program may be recorded in a computer-readable recording medium, and installed from the recording medium to the storage unit 19 of the control device 4. The computer-readable recording medium may be, for example, a hard disc (HD), a flexible disc (FD), a compact disc (CD), a magnet optical disc (MO), or a memory card.

In the substrate processing system 1 configured as described above, the substrate transfer device 13 of the carry-in/out station 2 first takes out a wafer W from a carrier C placed in the carrier placing section 11, and then places the taken wafer W on the transfer unit 14. The wafer W placed on the transfer unit 14 is taken out from the transfer unit 14 by the substrate transfer device 17 of the processing station 3 and carried into a processing unit 16.

The wafer W carried into the processing unit 16 is processed by the processing unit 16, and then, carried out from the processing unit 16 and placed on the delivery unit 14 by the substrate transfer device 17. After the processing of placing the wafer W on the delivery unit 14, the wafer W returns to the carrier C of the carrier placing section 11 by the substrate transfer device 13.

Figure 2:
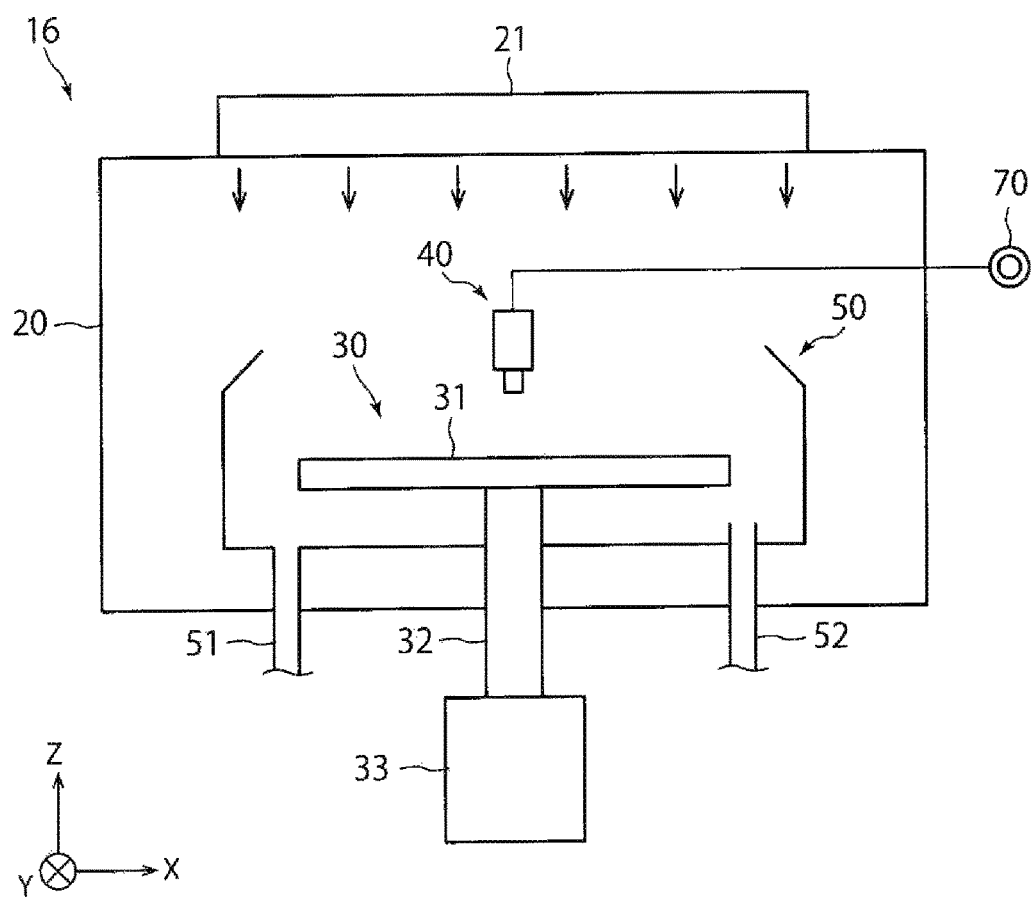
FIG. 2 is a view illustrating a schematic configuration of a processing unit 16.

Hereinafter, a schematic configuration of the processing unit 16 will be described with reference to FIG. 2. FIG. 2 is a view illustrating a schematic configuration of the processing unit 16.

As illustrated in FIG. 2, the processing unit 16 is provided with a chamber 20, a substrate holding mechanism 30, a processing fluid supply unit 40, and a recovery cup 50.

The chamber 20 accommodates the substrate holding mechanism 30, the processing fluid supply unit 40, and the recovery cup 50. A fan filter unit (FFU) 21 is provided on the ceiling of the chamber 20. The FFU 21 forms a downflow in the chamber 20.

The substrate holding mechanism 30 is provided with a holding unit 31, a support unit 32, and a driving unit 33. The holding unit 31 holds the wafer W horizontally. The support unit 32 is a vertically extending member, and has a base end portion supported rotatably by the driving unit 33 and a tip end portion supporting the holding unit 31 horizontally. The driving unit 33 rotates the support unit 32 around the vertical axis. The substrate holding mechanism 30 rotates the support unit 32 by using the driving unit 33, so that the holding unit 31 supported by the support unit 32 is rotated, and hence, the wafer W held in the holding unit 31 is rotated.

The processing fluid supply unit 40 supplies a processing fluid onto the wafer W. The processing fluid supply unit 40 is connected to a processing fluid source 70.

The recovery cup 50 is disposed to surround the holding unit 31, and collects the processing liquid scattered from the wafer W by the rotation of the holding unit 31. A drain port 51 is formed on the bottom of the recovery cup 50, and the processing liquid collected by the recovery cup 50 is discharged from the drain port 51 to the outside of the processing unit 16. Further, an exhaust port 52 is formed on the bottom of the recovery cup 50 to discharge a gas supplied from the FFU 21 to the outside.

Figure 3:
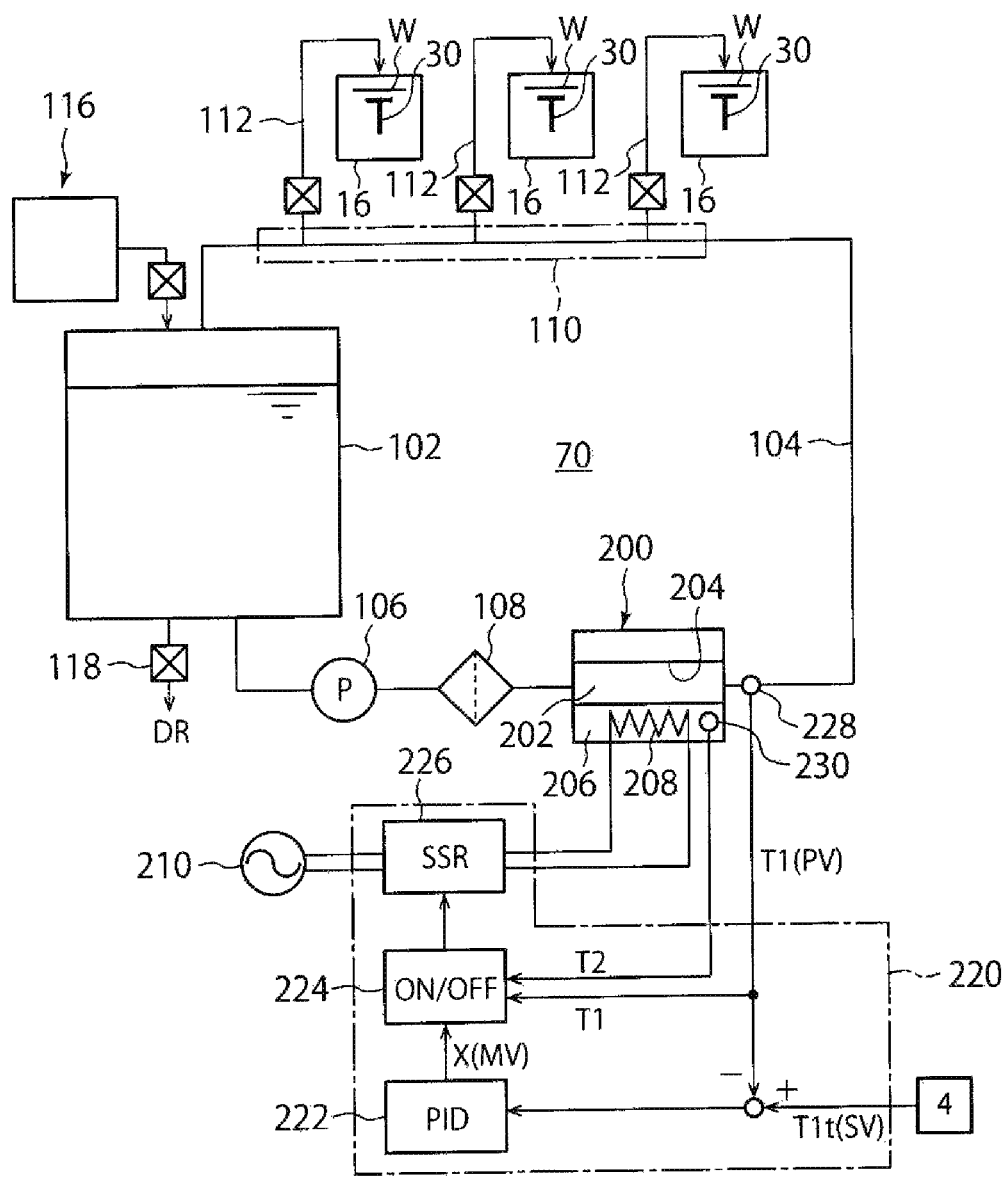
FIG. 3 is a view illustrating a piping diagram of a configuration of a processing fluid supply unit (a processing liquid supply unit), together with a block diagram of a configuration of a controller of a heater unit.

Hereinafter, descriptions will be made on a processing fluid source 70 (see, e.g., FIG. 2) configured to supply a processing liquid to the plurality of processing units 16 illustrated in FIG. 1, with reference to FIG. 3. The processing liquid is supplied to the plurality of processing units 16 by the common processing fluid source 70.

Each processing unit 16 of the substrate processing system 1 is configured to supply a plurality of kinds of processing liquids to a wafer W, respectively. The processing unit 16 according to the present exemplary embodiment is configured to supply processing liquids such as, for example, a chemical liquid (e.g., DHF or SC1), a rinsing liquid (e.g., pure water), and isopropyl alcohol (IPA) as a drying-auxiliary fluid, to the wafer W so as to perform a liquid processing on the wafer W. Accordingly, the processing fluid source 70 dedicated to each processing liquid is provided in the substrate processing system 1. Hereinafter, only the processing fluid source 70 for supplying IPA will be described.

The processing fluid source 70 includes a tank 102 that stores IPA (a processing liquid), and a circulation line 104 that comes out of the tank 102 and returns back to the tank 102. A pump 106 is provided in the circulation line 104. The pump 106 forms a circulating flow of IPA that comes out of the tank 102 and returns back to the tank 102 through the circulation line 104. A filter 108 configured to remove contaminants such as particles included in the IPA is provided in the circulation line 104 at the downstream side of the pump 106.

One or more branch lines 112 are connected to a connection area 110 set in the circulation line 104. Each branch line 112 supplies the IPA flowing in the circulation line 104 to the corresponding processing unit 16. An open/close valve 112a is provided in each branch line 112. For example, a flow rate control mechanism such as a flow rate control valve, and a filter may be provided in each branch line 112, as necessary.

The liquid processing apparatus includes a tank liquid supplement unit 116 configured to replenish the tank 102 with the IPA. When the processing liquid is a chemical liquid other than the IPA (e.g., dilute hydrofluoric acid (DHF)), the tank liquid supplement unit 116 may supply only a part (e.g., hydrofluoric acid (HF) or pure water) of chemical liquid constituents. A drain unit 118 is provided in the tank 102 to discard the IPA within the tank 102.

A heater unit 200 is provided in the circulation line 104 at the downstream side of the filter 108 to heat the IPA.

The heater unit 200 includes an internal flow path 202 therein, which constitutes a part of the circulation line 104. The internal flow path 202 is surrounded by a heating portion 206. The heating portion 206 may be formed by placing a heating element 208 made of a resistance heater such as, for example, a sheath heater, in a hole formed in a high heat conductive member made of, for example, an aluminum alloy. A liquid contact surface 204 of the internal flow path 202 is formed of a material that does not release (elute or drop) a harmful substance to the IPA (the processing liquid) flowing through the internal flow path. As such a material, for example, (1) quartz or (2) a fluorine-based resin such as, for example, a polytetrafluoroethylene (PTFE) or a tetrafluoroethylene/perfluoroalkyl vinyl ether copolymer (PFA), is exemplified, but the material is not limited thereto.

When a power is supplied from a power supply device 210, the heating element 208 is heated. The supply of the power to the heating element 208 is controlled by a heater control unit 220. The heater control unit 220 includes a PID controller 222, an ON/OFF controller 224, and a power adjustment unit 226. The power adjustment unit 226 controls a power to be supplied to the heating element 208 from the power supply device 210 according to a conventionally known control method such as, for example, a phase control, a cycle control, or an ON/OFF time-division control. The power adjustment unit 226 is formed of, for example, a semiconductor relay (SSR). The PID controller 222 and the ON/OFF controller 224 of the heater control unit 220 may be configured as a part of the control device 4.

An actual temperature T1 of the IPA flowing through the circulation line 104 around the outlet of the internal flow path 202 of the heater unit 200 (located slightly downstream of the outlet of the internal flow path 202 of the heater unit 200 in the present exemplary embodiment) is detected by the temperature sensor 228. Based on a deviation between a target temperature T1$t$ of the IPA received from the control device 4 as described above (which is a setting value (SV) in the PID control, and is determined in advance by a process recipe stored in the storage unit 19), and an actual temperature T1 of the IPA detected by the temperature sensor 228 (a measurement value (PV) in the PID control), the PID controller 222 calculates a power to be supplied to the heating element 208 that is required to match the actual temperature T1 with the target temperature T1$t$, and sends a command value (a manipulation value (MV) in the PID control) based on the calculation result to the power adjustment unit 226. Specifically, the PID controller 222, outputs a command value of X that means that "send X % (X ranges from 0 to 100) of the rated input (regular maximum input) of the heater unit 200 to the heating element 208," to the power adjustment unit 226. The power adjustment unit 226 controls the power to be supplied to the heating element 208 from the power supply device 210 so as to implement the command value.

An actual temperature T2 of the heating portion 206 of the heater unit 200 is detected by a temperature sensor 230. In the present exemplary embodiment, the temperature sensor 230 detects a temperature of the high heat conductive member embedded with the heating element 208. The temperature sensor 230 may measure the temperature of a component other than the heating portion 206 instead of the heating portion 206 itself of the heater unit 200, as long as the temperature sensor 230 can measure a temperature highly related to a calorific value (i.e., a residual heat) that the heating portion 206 has immediately after the supply of the power to the heating element 208 is interrupted. In the present exemplary embodiment, the temperature of the high heat conductive member that is considered to be most highly related to the calorific value that the heating portion 206 has immediately after the supply of the power to the heating element 208 is interrupted is detected.

Based on the temperature detected by the temperature sensor 230, the ON/OFF controller 224 adopts a through state where the command value X by the PID controller 222, as it is, is sent to the power adjustment unit 226, and a cut-off state where the command value X to be received by the power adjustment unit 226 is set to zero (0), regardless of the command value X by the PID controller 222. That is, it can be said that the ON/OFF controller 224 is configured to send a product obtained by multiplying the command value X received from the PID controller 222 by 1 to the power adjustment unit 226 in the through state, and to send a product obtained by multiplying the command value X received from the PID controller 222 by 0 to the power adjustment unit 226 in the cut-off state.

Based on the actual temperature T1 of the IPA detected by the temperature sensor 228, the ON/OFF controller 224 sets a first temperature threshold value T21 and a second temperature threshold value T22 (T21>T22) which serve as a reference for switching between the through state and the cut-off state (the setting method will be described below). The ON/OFF controller 224 always compares the first and second temperature threshold values T21 and T22 to the actual temperature T2 of the heating portion 206 detected by the temperature sensor 230, and switches between the through state and the cut-off state based on the comparison result. That is, it can be said that the ON/OFF controller 224 includes a threshold value setting unit configured to set the threshold value (the first and second temperature threshold values T21 and T22), and an ON/OFF operation unit that switches between the through state and the cut-off state based on the comparison result of the threshold value set by the threshold value setting unit to the actual temperature T2.

Specifically, the ON/OFF controller 224 is placed in the cut-off state when the actual temperature T2 of the heating portion 206 is higher than the first temperature threshold value T21, and is placed in the through state when the actual temperature T2 is lower than the second temperature threshold value T22. When the actual temperature T2 is higher than the second temperature threshold value T22 and lower than the first temperature threshold value T21 because the actual temperature T2 falls from a temperature higher than the first temperature threshold value T21, the ON/OFF controller 224 is placed in the cut-off state. When such a temperature is caused because the actual temperature T2 rises from a temperature lower than the second temperature threshold value T22, the ON/OFF controller 224 is placed in the through state. By providing the hysteresis, a control is prevented from becoming unstable.

Hereinafter, a specific operation of the processing fluid source 70 for supplying IPA will be described in an example where the IPA of 70° C. is supplied as a processing liquid to the processing unit 16.

In a state at a starting point, a predetermined amount of IPA at a normal temperature (or at a temperature lower than a set temperature during operation) is stored in the tank 102, and the IPA is circulated through the circulation line 104 by the pump 106. From the state, the IPA present in the circulation system constituted by the tank 102 and the circulation line 104 is quickly and safely heated up to 70° C. Here, "safely" indicates that even though the circulation of the IPA is stopped suddenly by unforeseen circumstances, the IPA present within the heater unit 200 is not boiled by only immediately stopping the supply of a power to the heating portion 206 of the heater unit 200 (hereinafter, which is also referred to as "safety requirements"). When the IPA within the heater unit 200 is boiled, the heater unit 200 (particularly, a quartz or resin material that constitutes the liquid contact surface 204) may be damaged due to the pressure rise, and further, the IPA may be leaked.

The control device 4 is configured to perform a control that causes a current cut-off device (e.g., an electromagnetic contactor) within the power supply device 210 to be operated so that the supply of the power from the power supply device 210 to the heater unit 200 is stopped when the pump 106 is unintentionally stopped or a failure equivalent to the stoppage in the pump 106 is detected. Similarly, in a case where a power failure occurs in a semiconductor manufacturing factory, the pump 106 is stopped and the supply of the power to the heater unit 200 is stopped so that the above described state is made. Accordingly, in order to satisfy the safety requirements described above, the temperature of the heating portion 206 only has to be always maintained at a temperature where the IPA present within the internal flow path 202 of the heater unit 200 is not boiled by the calorific value (the residual heat) maintained by the heating portion 206 of the heater unit 200 when the circulation of the IPA is stopped and the supply of the power to the heater unit 200 is stopped. In order to satisfy the safety requirements described above, the temperature of the heating portion 206 is controlled by the ON/OFF controller 224.

The temperature of the heating portion 206 that satisfies the safety requirements will be described with reference to the table of FIG. 4. The table of FIG. 4 represents a maximum temperature Timax of the IPA within the internal flow path 202 of the heater unit 200 that is heated by the calorific value (the residual heat) that the heating portion 206 has after the circulation of the IPA is stopped and the supply of the power to the heating element 208 is stopped, through a relationship of combinations of a temperature Ti (detectable by the temperature sensor 228 and same as T1 described above) of the IPA flowing through the circulation line 104 and a temperature Th (detectable by the temperature sensor 230 and same as T2 described above) of the heating portion 206 just before the circulation stoppage of the IPA. For example, when Ti=70° C. and Th=105° C., Timax is 82.5° C.

With reference to this table, a heating portion upper limit temperature Thmax is determined for each IPA temperature Ti such that Timax does not exceed 83° C. which is a boiling point of IPA, that is, Timax does not reach and exceed an IPA upper limit temperature (a processing liquid upper limit temperature) that is an IPA temperature that may cause damage to the heater unit 200. The heating portion upper limit temperature Thmax refers to a maximum temperature allowed for the heating portion 206. When the actual temperature T2 of the heating portion 206 detected by the temperature sensor 230 exceeds the heating portion upper limit temperature Thmax, the supply of the power to the heating portion 206 is interrupted. The first and second temperature threshold values T21 and T22 described above are determined based on the heating portion upper limit temperature Thmax. The heating portion upper limit temperature Thmax is a temperature set to avoid boiling of the IPA, and thus is set to be a lower value as the IPA temperature Ti increases. For example, Thmax is set to 130° C. when Ti≤50° C., 120° C. when 50° C.<Ti≤60° C., 110° C. when 60° C.<Ti≤65° C., and 105° C. when 65° C.<Ti≤70° C. The first and second temperature threshold values T21 and T22 are stored in the control device 4 in advance.

Thmax is determined in consideration of a certain degree of safety margin. For example, from the table of FIG. 4, it can be seen that in the column of Thmax=130° C., even when Ti is 60° C., Timax is 80° C. which is lower than the boiling point (83° C.) of IPA. Thus, it is thought that until Ti is 60° C., Thmax may be set to 130° C. However, thereby, when the circulation of the IPA is suddenly stopped just after Ti exceeds 60° C. and thus Thmax is switched to 120° C. (at this time, the heating portion 206 has a residual heat equivalent to Thmax=130° C.), Timax may exceed 83° C. that is a boiling point of the IPA. In order to avoid occurrence of such a situation with a margin, the range of the IPA temperature Ti corresponding to Thmax=130° C. is set to be low. That is, as described above, when Ti≤50° C., Thmax is set to 130° C. The range of the IPA temperature Ti corresponding to Thmax=120° C. is also set to be low. When the actual IPA temperature Ti is close to a final target temperature, that is, 70° C., the power supplied to the heater unit 200 is decreased (of course, because a PID control is performed), thereby decreasing a possibility that the situation described above occurs. Accordingly, for example, as described above, when 60° C.<Ti≤65° C., Thmax is set to 110° C.

In order to provide the control hysteresis described above, the first temperature threshold value T21 and the second temperature threshold value T22 corresponding to each heating portion upper limit temperature Thmax are determined. As an example, it is set that the first temperature threshold value T21=the heating portion upper limit temperature Thmax, and the second temperature threshold value T22=the heating portion upper limit temperature Thmax −0.5° C. For example, when the heating portion upper limit temperature Thmax=105° C., the first temperature threshold value T21 and the second temperature threshold value T22 corresponding to the Thmax value are 105° C. and 104.5° C., respectively.

Descriptions will be made on under the above settings, the process of heating the IPA of a normal temperature that circulates within the circulation system constituted by the tank 102 and the circulation line 104 to 70° C., with reference to the graph of FIG. 5.

Figure 5:
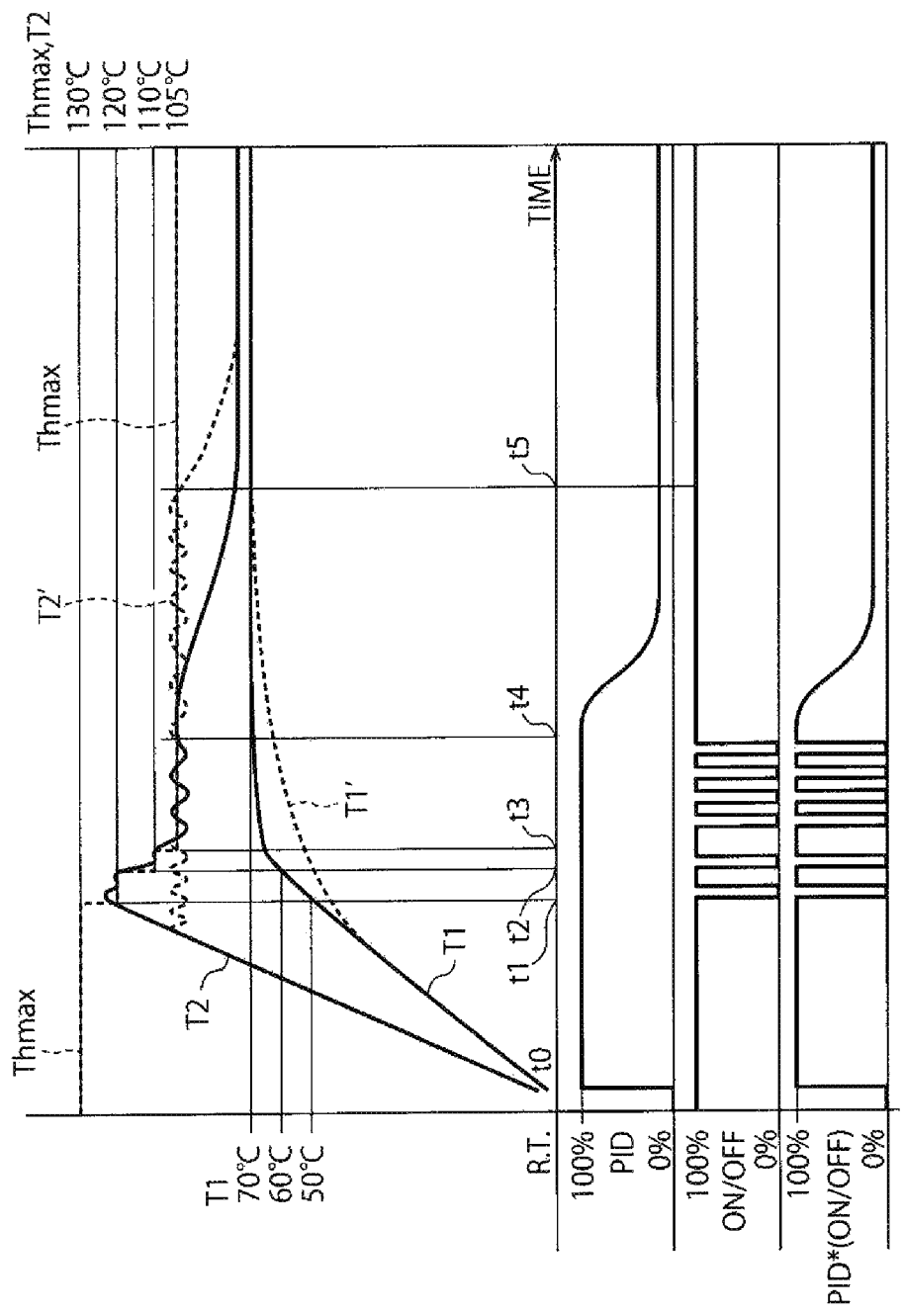
FIG. 5 is a graph illustrating a change of a temperature and a supplied power at a temperature rise.

The upper side of the graph of FIG. 5 illustrates a temporal change of each of the actual temperature T1 of the IPA detected by the temperature sensor 228, the actual temperature T2 of the heating portion 206 detected by the temperature sensor 230, and the heating portion upper limit temperature Thmax. The lower side of the graph of FIG. 5 illustrates a temporal change of each of the output (the command value) of the PID controller 222, the output (the command value) of the ON/OFF controller 224, and lastly the command value received by the power adjustment unit 226, successively from the top.

As illustrated in FIG. 5, after a heating starting time point t0, the actual temperature T2 of the heating portion 206 gradually increases, and thereby the actual temperature T1 of the IPA also gradually increases. At a time point slightly prior to a time point t1, the actual temperature T2 of the heating portion 206 exceeds 120° C. However, at this time point, since the heating portion upper limit temperature Thmax is 130° C., the ON/OFF controller 224 is placed in the through state, and the command value X sent from the PID controller 222 is input to the power adjustment unit 226 as it is. Accordingly, here, the power supplied to the heating portion 206 is controlled by a general PID control.

At the time point t1, the actual temperature T1 of the IPA exceeds 50° C. Then, the heating portion upper limit temperature Thmax is switched from 130° C. to 120° C. Then, since the actual temperature T2 of the heating portion 206 exceeds the heating portion upper limit temperature Thmax, the ON/OFF controller 224 cuts off the command value X sent from the PID controller 222 to the power adjustment unit 226. Then, the ON/OFF controller 224 performs an ON/OFF control with a hysteresis using the first temperature threshold value T21 (e.g., 120° C.) and the second temperature threshold value T22 (e.g., 119.5° C.) determined according the heating portion upper limit temperature Thmax. Meanwhile, without taking the state of the ON/OFF controller 224 into consideration at all, the PID controller 222 continuously generates a command value X based on the deviation between the actual temperature T1 of the IPA and the target temperature 70° C. of the IPA. That is, a command value obtained by multiplying the command value X generated by the PID controller 222 (here, the command value X varies according to time) by 0 (zero) or 1 in the ON/OFF controller 224 is sent to the power adjustment unit 226.

At a time point t2, the actual temperature T1 of the IPA exceeds 60° C. Then, the heating portion upper limit temperature Thmax is switched from 120° C. to 110° C. At a time point t3, the actual temperature T1 of the IPA exceeds 65° C. Then, the heating portion upper limit temperature Thmax is switched from 110° C. to 105° C. That is, as the actual temperature of the processing liquid changes from a temperature below and away from the target temperature of the processing liquid to a temperature close to the target temperature, the heating portion upper limit temperature is set to a temperature which changes from a temperature above and away from the target temperature of the processing liquid to a lower temperature (a temperature coming closer to the target temperature). Between the time points t2 and t3, and at and after the time point t3, the operation of each of the PID controller 222 and the ON/OFF controller 224 is the same as that between the time points t1 and t2 as described above. When the actual temperature T1 of the IPA approaches the target temperature of 70° C., the PID controller 222 does not output a large command value any more, and thus the actual temperature T2 of the heating portion 206 does not greatly increase. Accordingly, the ON/OFF controller 224 is substantially maintained in a through state (at and after a time point t4).

According to the exemplary embodiment described above, since the heating portion upper limit temperature Thmax is changed in association with the actual temperature T1 of the IPA, the heating ability of the heater unit 200 is utilized to the maximum while ensuring that the IPA within the heater unit 200 is prevented from being boiled even when the IPA circulation is unexpectedly stopped. Accordingly, heating of the IPA may be quickly performed. This effect will be described with reference to the action of Comparative Example illustrated in FIG. 5.

In Comparative Example, the heating portion upper limit temperature Thmax is fixed to 105° C. That is, the heating portion upper limit temperature Thmax is set such that the IPA is not boiled within the heater unit 200 even when the IPA circulation is abruptly stopped at all assumable actual temperatures T1 of the IPA. In this case, the actual temperature T2 of the heating portion 206 reaches the heating portion upper limit temperature Thmax early, and then, the repetition of ON/OFF operations is continued over a long period of time by the ON/OFF controller 224. Thus, the total power supplied to the heating element 208 of the heater unit 200 is reduced, and thus the heating of the IPA is largely delayed as compared to the exemplary embodiment described above. The actual temperature T1' of the IPA and the actual temperature T2' of the heating portion 206 in Comparative Example are indicated by broken lines in the graph of FIG. 5. That is, in Comparative Example, from a time point slightly prior to the time point t1 to a time point t5, ON/OFF operations are repeated by the ON/OFF controller 224, and thus, the time required until the actual temperature T1' of the IPA reaches the target temperature of 70° C. is largely increased as compared to the exemplary embodiment.

Whereas, in the exemplary embodiment described above, based on the variable heating portion upper limit temperature Thmax determined in consideration of the possibility that the IPA may boil within the heater unit 200 when the IPA circulation is abruptly stopped, the ON/OFF control is performed by the ON/OFF controller 224. That is, in the exemplary embodiment described above, in consideration of the fact that the IPA having a low actual temperature T1 is not easily boiled even when the IPA within the heater unit 200 is heated by the residual heat of the heating portion 206 after energization to the heating element 208 is stopped, the heating portion upper limit temperature Thmax is set to be high when the actual temperature T1 of the IPA is low. Thus, when the actual temperature T1 of the IPA is low, the power supplied to the heating element 208 may be increased, thereby quickly performing the heating of the IPA.

Further, as can be understood from the above description, after the actual temperature T1 of the IPA reaches the vicinity of the target temperature T1t, the ON/OFF controller 224 is hardly placed in a cut-off state (except when the IPA is replenished by the tank liquid supplement unit 116), as long as an abnormality does not occur. Thus, through the PID control by the PID controller 222 (without being disturbed by the operation of the ON/OFF controller 224), the actual temperature T1 of the IPA may be stably maintained in the vicinity of the target temperature.

The PID controller 222 and the ON/OFF controller 224 may be configured as hardware (electronic devices) which may be recognized as separate independent parts and may be configured as an integrated electronic device. Alternatively, the PID controller 222 and the ON/OFF controller 224 may be implemented by a program executed by a computer. Specific configurations thereof may be arbitrary as long as the same functions as those in the above-described exemplary embodiment are implemented.

In the exemplary embodiment described above, the ON/OFF controller 224 is configured to intervene in the control signal that is sent from the PID controller 222 to the power adjustment unit 226 serving as a power control device (a power control element) (so as to allow the control signal as it is to pass or invalidate the control signal (to zero)), but the ON/OFF controller 224 is not limited thereto. The ON/OFF controller 224 may perform a control of cutting off the power supplied to the heater unit 200 by operating a current cut-off device (e.g., an electromagnetic contactor, not illustrated) provided in the power supply device 210. In this case, the output of the PID controller 222 is always sent to the power adjustment unit 226 as it is. Above all, when the power adjustment unit 226 employs a switching element such as, for example, a semiconductor relay, providing the ON/OFF controller 224 as in the exemplary embodiment described above is advantageous from the viewpoint of a device cost.

In the exemplary embodiment described above, the processing liquid handled by the processing fluid source 70 is IPA, but is not limited thereto. Any processing liquid such as, for example, an acidic chemical liquid, an alkaline chemical liquid, an organic chemical liquid, or pure water may be used.

In the exemplary embodiment described above, the actual temperature T1 that IPA may take is divided into a plurality of temperature zones, and a heating portion upper limit temperature Thmax unchanged for each temperature zone is defined. Thus, according to an increase of the actual temperature T1 of the IPA, the heating portion upper limit temperature Thmax is adapted to change in stages (in a stepwise manner). However, the present disclosure is not limited thereto, the heating portion upper limit temperature Thmax may be adapted to continuously change. That is, for example, the heating portion upper limit temperature Thmax may be set based on a linear function (Thmax=a·T1+b (a and b are integers)).

In the exemplary embodiment described above, the heating portion upper limit temperature Thmax is set as a temperature at which, when the flow of the IPA (the processing liquid) within the circulation line 104 is stopped and the supply of the power to the heating element 208 of the heater unit 200 is stopped, it is guaranteed that the IPA present within the internal flow path 202 of the heater unit 200 is not boiled by the calorific value that the heating portion 206 has, but is not limited thereto. The heating portion upper limit temperature Thmax may be determined in association with an event other than boiling that may relate to the damage of the heater unit 200 (e.g., a deformation or a heat resistant temperature of a resin material constituting the heater unit 200).

In the exemplary embodiment described above, the processing fluid source 70 configured to supply a processing liquid to the processing unit 16 (a wafer W) includes the tank 102, the circulation line 104, and one or more branch lines 112. That is, the branch line 112, and a part of the circulation line 104 leading from the tank 102 down to the branch line 112 constitutes a processing liquid supply line. However, the present disclosure is not limited thereto. The circulation line may not be provided, but a processing liquid supply line (not illustrated) may be provided to connect the tank 102 that stores the processing liquid to the processing unit 16, and the heater unit 200 may be provided in the processing liquid supply line.

In the exemplary embodiment described above, the heater unit 200 uses a resistance heater as a heating element, but is not limited thereto. The heater unit 200 may include a halogen lamp as a heating element.

A workpiece processed by the processing unit 16 is not limited to the semiconductor wafer W, but may be another kind of substrate such as, for example, a glass substrate or a ceramic substrate.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A liquid processing apparatus comprising:
    a processing liquid supply line configured to supply a processing liquid from a processing liquid source to a workpiece;
    a heater including a heating element and conductive material, and configured to heat the processing liquid flowing in the processing liquid supply line;
    a heater controller configured to control a power to be supplied to the heating element;
    a first temperature sensor located along the processing liquid supply line configured to measure a temperature of the processing liquid flowing in the processing liquid supply line; and
    a second temperature sensor located at the heater configured to measure a temperature of the heater,
    wherein the heater controller performs a cut-off control that cuts off the power supplied to the heating element when it is determined that a maximum temperature of the processing liquid within the heater is equal to or higher than a processing liquid upper limit temperature, the maximum temperature is a set of separate preset values representing a maximum temperature of the processing liquid within the heater that would be heated by a residual heat of the heater when a supply of the power to the heating element is stopped, and each preset value corresponding to a combination of the temperature of the processing liquid measured by the first temperature sensor and the heater temperature measured by the second temperature sensor.

2. The liquid processing apparatus of claim 1, wherein the processing liquid upper limit temperature is a temperature at which the processing liquid within the heater imparts damage to the heater.

3. The liquid processing apparatus of claim 1, wherein the processing liquid upper limit temperature is a temperature at which the processing liquid is boiled, and
    the processing liquid upper limit temperature is set according to a kind of the processing liquid.

4. The liquid processing apparatus of claim 1, wherein the heater controller includes:
a first power controller configured to determine a power to be supplied to the heater so that the temperature of the processing liquid in the processing liquid supply line reaches a target temperature based on a deviation between the temperature of the processing liquid detected by the first temperature sensor and the target temperature of the processing liquid, and
a second power controller configured to perform the cut-off control when a temperature of the heater exceeds a heater upper limit temperature having a corresponding processing liquid temperature that together yield a maximum temperature of the processing liquid within the heater equal to or higher than the processing liquid upper limit temperature, and allows the power determined by the first controller to be supplied to the heater when the temperature of the heater is equal to or lower than the heater upper limit temperature.

5. The liquid processing apparatus of claim 4, wherein, as the temperature of the processing liquid changes from a temperature below the target temperature of the processing liquid to a temperature close to the target temperature, the heater upper limit temperature is set to a temperature which changes from a temperature above the target temperature of the processing liquid to a temperature closer to the target temperature while maintaining the maximum temperature of the processing liquid within the heater to be below the processing liquid upper limit temperature.

6. The liquid processing apparatus of claim 4, wherein the temperature of the processing liquid is divided into a plurality of temperature zones, and the heater upper limit temperature is set for each of the temperature zones.

7. The liquid processing apparatus of claim 6, wherein, when the temperature of the processing liquid is initially increased, the heater upper limit temperature is set to a first heater upper limit temperature corresponding to a first temperature zone of the plurality of temperature zones of the processing liquid until the temperature of the processing liquid reaches a second temperature zone of the plurality of temperature zones of the processing liquid higher than the first temperature zone, and the heater upper limit temperature is set to a second heater upper limit temperature lower than the first heater upper limit temperature.

8. The liquid processing apparatus of claim 4, wherein the heater controller includes a PID controller serving as the first controller, an ON/OFF controller serving as the second controller, and a current adjuster, and
the ON/OFF controller is interposed between the PID controller and the current adjuster to perform a control of changing a power command value output from the PID controller to the current adjustment unit to zero and outputting the power command value to the current adjustment unit, or outputting the power command value to the current adjuster as it is, or perform an equivalent control thereof.

9. The liquid processing apparatus of claim 1, further comprising:
a tank configured to serve as the processing liquid source that stores the processing liquid;
a circulation line connected to the tank and configured to cause the processing liquid flowing out from the tank to flow through the circulation line and then flow into the tank;
a liquid processing unit including a nozzle and configured to perform a liquid processing on the workpiece using the processing liquid flowing through the circulation line; and
a branch line split from the circulation line to supply the processing liquid flowing through the circulation line to the processing unit,
wherein the processing liquid supply line is constituted by at least a part of the circulation line and the branch line.

10. A control method of a heater comprising:
performing a liquid processing on a workpiece by supplying a processing liquid to the workpiece through a processing liquid supply line from a processing liquid source; and
controlling a temperature of the processing liquid flowing in the processing liquid supply line by controlling a power to be supplied to a heating element provided in a heater, the heater being configured to heat the processing liquid flowing in the processing liquid supply line,
wherein controlling the temperature includes performing a cut-off control that cuts off the power to be supplied to the heating element when it is determined that an event where a maximum temperature that the processing liquid within the heater reaches exceeds a processing liquid upper limit temperature, the maximum temperature is a set of separate preset values representing a maximum temperature of the processing liquid within the heater that would be heated by a residual heat of the heater when a supply of the power to the heating element is stopped, and each preset value corresponding to a combination of the temperature of the processing liquid measured by a first temperature sensor located along the processing liquid supply line and a temperature of the heater measured by a second temperature sensor located at the heater.

11. The method of claim 10, wherein the processing liquid upper limit temperature is a temperature at which the processing liquid is boiled, and
the processing liquid upper limit temperature is set according to a kind of the processing liquid.

12. The method of claim 10, wherein the temperature of the processing liquid is divided into a plurality of temperature zones, and a heater upper limit temperature is set for each of the temperature zones.

13. The method of claim 12, wherein, when the temperature of the processing liquid is initially increased, the heater upper limit temperature is set to a first heater upper limit temperature corresponding to a first temperature zone of the plurality of temperature zones of the processing liquid until the temperature of the processing liquid reaches a second temperature zone of the plurality of temperature zones of the processing liquid higher than the first temperature zone, and the heater upper limit temperature is set to a second heater upper limit temperature lower than the first heater upper limit temperature.

* * * * *